(12) United States Patent
Lee et al.

(10) Patent No.: US 9,905,630 B2
(45) Date of Patent: Feb. 27, 2018

(54) DISPLAY APPARATUS

(71) Applicant: SAMSUNG DISPLAY CO., LTD., Yongin-si, Gyeonggi-do (KR)

(72) Inventors: Sunhee Lee, Yongin-si (KR); Juchan Park, Yongin-si (KR); Younggug Seol, Yongin-si (KR); Pilsuk Lee, Yongin-si (KR)

(73) Assignee: Samsung Display Co., Ltd., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/375,206

(22) Filed: Dec. 12, 2016

(65) Prior Publication Data

US 2017/0373128 A1    Dec. 28, 2017

(30) Foreign Application Priority Data

Jun. 27, 2016  (KR) ..................... 10-2016-0080405

(51) Int. Cl.
*H01L 27/32* (2006.01)
*H01L 51/52* (2006.01)

(52) U.S. Cl.
CPC ...... *H01L 27/3276* (2013.01); *H01L 27/3258* (2013.01); *H01L 51/5253* (2013.01); *H01L 51/5237* (2013.01)

(58) Field of Classification Search
None
See application file for complete search history.

(56) References Cited

U.S. PATENT DOCUMENTS

| 7,936,122 B2 | 5/2011 | Izumi et al. |
| 2015/0041769 A1 | 2/2015 | Kim et al. |
| 2015/0060784 A1 | 3/2015 | Lee et al. |
| 2015/0349293 A1 | 12/2015 | Park et al. |
| 2016/0133874 A1* | 5/2016 | Kim ................... H01L 51/5259 257/40 |

FOREIGN PATENT DOCUMENTS

| KR | 10-2009-0064320 A | 6/2009 |
| KR | 10-2015-0027434 A | 3/2015 |
| KR | 10-2015-0136725 A | 12/2015 |

\* cited by examiner

*Primary Examiner* — Michelle Mandala
(74) *Attorney, Agent, or Firm* — Lee & Morse, P.C.

(57) ABSTRACT

A display apparatus includes a substrate, a display unit over the substrate, the display unit including a thin film transistor, a display element connected to the thin film transistor, and a planarization layer between the thin film transistor and the display element. The display unit includes a display area to display an image, and a non-display area outside of the display area. The non-display area includes a plurality of voltage lines. The planarization layer extends into the non-display area and includes a divisional portion that divides the planarization layer into a central portion and a peripheral portion. The divisional portion surrounds the display area. An interlayer insulating film is between voltage lines at intersections of the voltage lines with each other in the divisional portion. A protecting film covers a side of the interlayer insulating film in the divisional portion.

25 Claims, 5 Drawing Sheets

DISPLAY APPARATUS

CROSS-REFERENCE TO RELATED APPLICATION

Korean Patent Application No. 10-2016-0080405, filed on Jun. 27, 2016, in the Korean Intellectual Property Office, and entitled: "Display Apparatus," is incorporated by reference herein in its entirety.

BACKGROUND

1. Field

One or more embodiments relate to a display apparatus.

2. Description of the Related Art

According to rapid development of display techniques to visually display various electrical signal information, flat display apparatuses having excellent characteristics, such as slim, light-weight, and low-power consumption, have been researched and developed.

SUMMARY

Embodiments are directed to a display apparatus including a substrate a display unit over the substrate, the display unit including a thin film transistor, a display element connected to the thin film transistor, and a planarization layer interposed between the thin film transistor and the display element, the display unit including a display area to display an image, and a non-display area located outside of the display area, the non-display area including a plurality of voltage lines, wherein the planarization layer extends into the non-display area and includes a divisional portion that divides the planarization layer into a central portion and a peripheral portion, the divisional portion surrounding the display area, an interlayer insulating film between the plurality of voltage lines at intersections of the plurality of voltage lines with each other in the divisional portion, a protecting film covering a side of the interlayer insulating film in the divisional portion, and a thin film encapsulating layer sealing the display unit.

The plurality of voltage lines may include a first voltage line, a second voltage line, and a third voltage line to which different voltages are respectively supplied. The first voltage line may include a first main voltage line corresponding to a portion of the display area, and a first connector protruding from the first main voltage line along a first direction and crossing the divisional portion. The second voltage line may include a second main voltage line surrounding both ends of the first main voltage line and a remaining portion of the display area, and a second connector protruding from the first main voltage line along the first direction and crossing the divisional portion. The third voltage line may include a third main voltage line surrounding both ends of the first main voltage line and the remaining portion of the display area, and a third connector protruding from the first main voltage line along the first direction and crossing the divisional portion. The first connector, the second connector, and the third connector may be connected to a pad unit.

The third voltage line may intersect at least one of the first voltage line and the second voltage line.

The first voltage line may be over an upper surface of the interlayer insulating film. The protecting film may cover at least a portion of a side of the first voltage line disposed over the upper surface of the interlayer insulating film.

The protecting film may expose an upper surface of the first voltage line in the divisional portion. The exposed upper surface of the first voltage line in the divisional portion may directly contact the thin film encapsulating layer.

The second voltage line may be over an upper surface of the interlayer insulating film. The protecting film may cover at least a portion of a side of the second voltage line disposed over the upper surface of the interlayer insulating film.

The protecting film may expose an upper surface of the second voltage line in the divisional portion. The exposed upper surface of the second voltage line in the divisional portion may directly contact the thin film encapsulating layer.

The first connector, the second connector, and the third connector may be parallel to each other and may be spaced from each other in a second direction intersecting the first direction.

The first connector may be over an upper surface of the interlayer insulating film. The protecting film may cover at least a portion of the first connector disposed over the upper surface of the interlayer insulating film.

The protecting film may expose an upper surface of the first connector in the divisional portion. The exposed upper surface of the first connector in the divisional portion may directly contact the thin film encapsulating layer.

The second connector may be located over an upper surface of the interlayer insulating film. The protecting film may cover at least a portion of a side of the second connector located over an upper surface of the interlayer insulating film.

The protecting film may expose an upper surface of the second connector. The exposed upper surface of the second connector in the divisional portion may directly contact the thin film encapsulating layer.

The interlayer insulating film may include an organic material.

The protecting film may include an inorganic material.

The central portion of the planarization layer may overlap and contact an inside periphery of the second main voltage line.

The display apparatus may further include a dam portion overlapping and contacting an outside periphery of the second main voltage line, wherein the dam portion is in the divisional portion.

The dam portion may include a same material as the planarization layer.

The thin film encapsulating film may include more than one organic film and more than one inorganic film. The more than one organic film may be within a boundary defined by the dam portion. The more than one inorganic film may extend to an outside of the peripheral portion.

The display element may include a first electrode electrically connected to the thin film transistor, a second electrode corresponding to the first electrode, and an intermediate layer including an organic light-emitting layer interposed between the first electrode and the second electrode.

Embodiments are also directed to a display apparatus including a substrate, a plurality of pixels on a display area of the substrate, a non-display area surrounding the display area of the substrate, the non-display area including a pad area and a plurality of voltage lines connecting the pad area and the display area, a planarization layer that extends from the display area into the non-display area, the planarization layer including a central portion, a peripheral portion, and a divisional portion between the central portion and the peripheral portion of the planarization layer, the divisional portion being in the non-display area surrounding the display area. The non-display area includes a first connector extending from a first main voltage line and crossing the divisional portion to connect to the pad area, a second connector extending from a second main voltage line in the divisional portion and connecting to the pad area, a third connector extending from the third main voltage line in the divisional portion and connecting to the pad area, wherein the third connector intersects at least one of the first connector and the second connector in the divisional portion, the third connector being separated from the at least one of the first connector and the second connector by an interlayer insulating film, and a protecting film covers sides of the interlayer insulating film in the divisional portion.

The interlayer insulating film may be an organic film. The protecting film may be an inorganic film.

The second connector may intersect the third connector in a parallel overlapping manner. The protecting film may cover sides of the third connector and the interlayer insulating film.

The interlayer insulating film may be substantially absent from the divisional portion, except for being between the second connector and the third connector. The protecting film may further cover sides of the interlayer insulating film at a boundary between the divisional portion and the display area and at a boundary between the divisional portion and a portion of the non-display area surrounding the divisional portion.

The first connector may cross the third connector. The protecting film may cover sides of the first connector and the interlayer insulating film.

The central portion of the planarization layer may overlap and contact an inside periphery of the second main voltage line. The planarization layer further may further include a dam portion that contacts an outside periphery of the second main voltage line.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
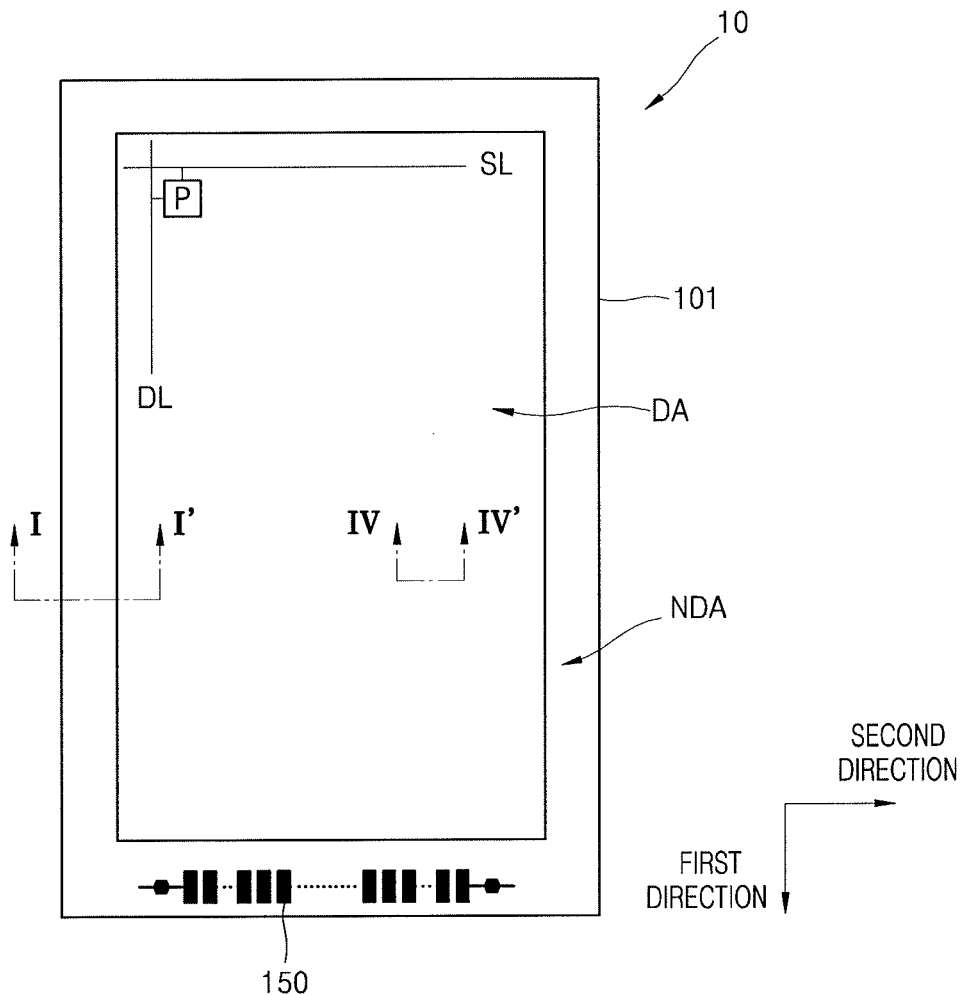
FIG. 1 illustrates a plan view schematically depicting a display apparatus according to one embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

Figure 2:
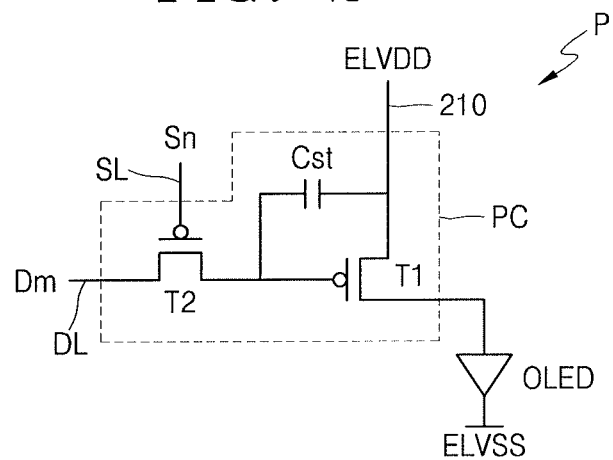
FIG. 2 illustrates a circuit diagram depicting an example of an equivalent circuit of a pixel of FIG. 1.
Figure 3:
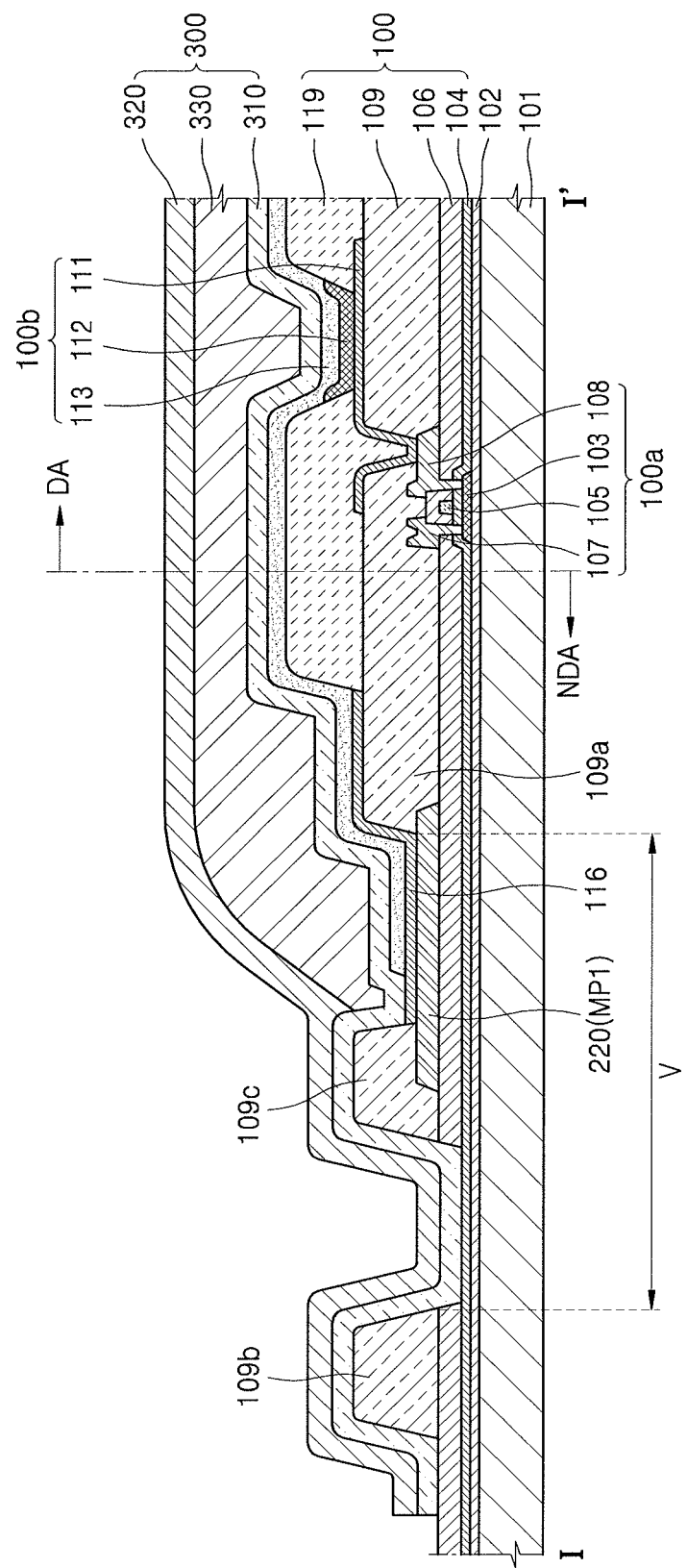
FIG. 3 illustrates a cross-sectional view taken along a line I-I' of FIG. 1.
Figure 4:
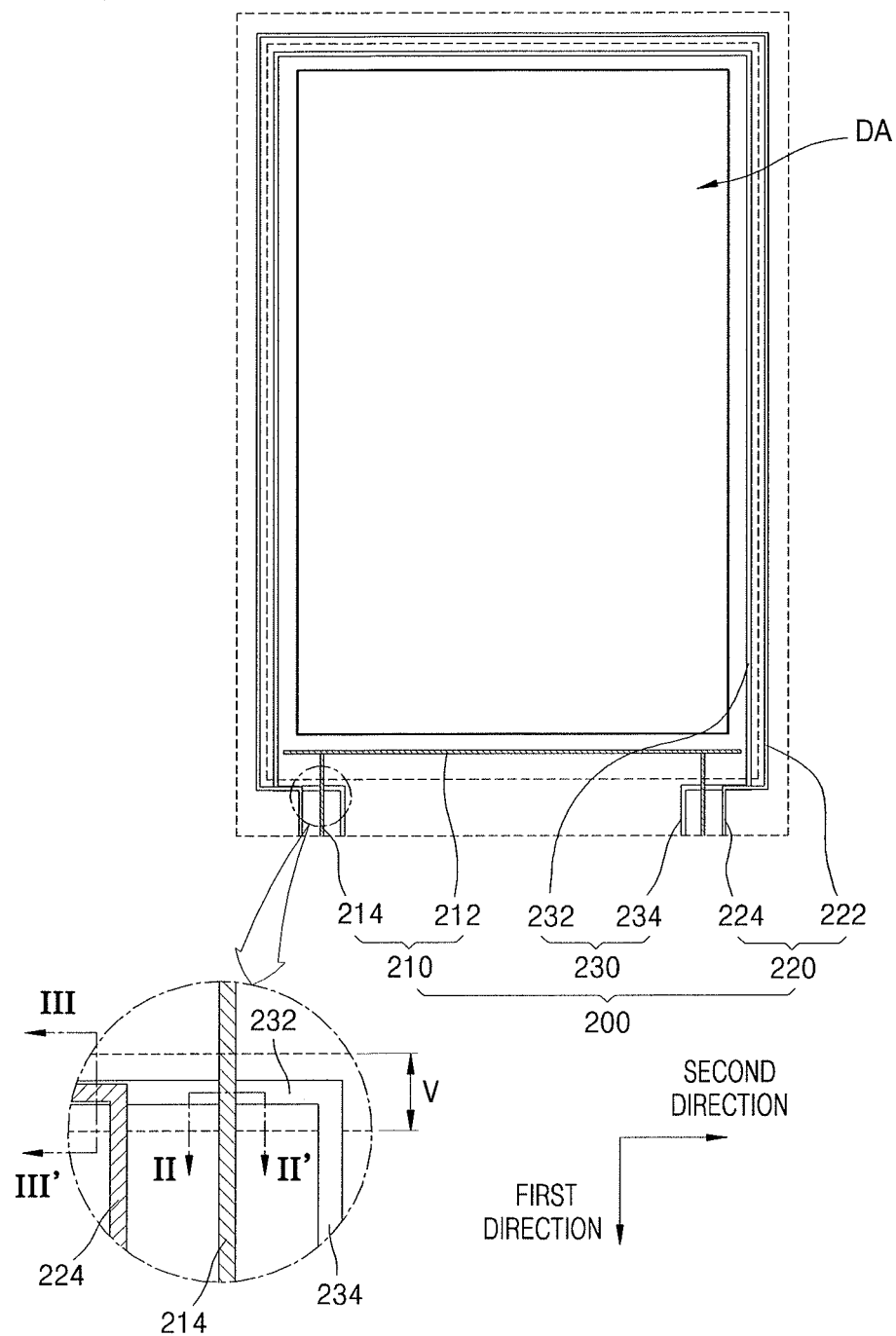
FIG. 4 illustrates a plan view schematically depicting a voltage line and a planarization layer of the display apparatus of FIG. 1.

FIG. 1 illustrates a plan view schematically depicting a display apparatus 10 according to an embodiment, FIG. 2 illustrates a circuit diagram depicting an example of an equivalent circuit of a pixel of FIG. 1, FIG. 3 illustrates a cross-sectional view taken along a line I-I' of FIG. 1, and FIG. 4 illustrates a plan view schematically depicting a voltage line and a planarization layer of the display apparatus 10 of FIG. 1.

Referring to FIGS. 1 through 4, the display apparatus 10 may include a substrate 101, a display unit 100 disposed over the substrate 101, and a thin film encapsulating layer 300.

The substrate 101 may include various materials. For example, the substrate may include a transparent glass material which may include $SiO_2$ as a main component. In some implementations, the substrate 101 may include a transparent plastic material. The plastic material may include polyethersulfone (PES), polyacrylate (PAR), polyetherimide (PEI), polyethylene naphthalate (PEN), polyethylene terephthalate (PET), polyethylene sulfide (PPS), polyallylate, polyimide, polycarbonate (PC), cellulose tri acetate (TAC), cellulose acetate propionate (CAP), etc.

When the display apparatus 10 is a rear emission type to direct an image in a direction toward the substrate 101, the substrate 101 may include a transparent material. When the display apparatus 10 is a front emission type to direct an image in an opposite direction, the substrate 101 may be a material other than a transparent material. For example, the substrate 101 may include a metal. When the substrate 101 includes a metal, the metal may be iron (Fe), chromium (Cr), manganese (Mn), nickel (Ni), titanium (Ti), molybdenum (Mo), stainless steel (SUS), Invar alloy, Inconel alloy, Kovar alloy, etc.

The display unit 100 may be disposed over the substrate 101. The display unit 100 may include a display area DA to display an image that is recognizable by a user, and a non-display area NDA in a peripheral area of the display area DA.

The display area DA may include a plurality of pixels P. The plurality of pixels P may be located at a portion where a data line DL and a scan line SL intersect. The non-display area NDA may include a voltage line 200 to supply a voltage to the display area DA. In addition, the non-display area NDA may include a pad unit 150 to transmit electrical signals to the display area DA from a power supply apparatus or a signal generating apparatus.

The pixel P may be driven by various structures. FIG. 2 illustrates an example of an equivalent circuit of the pixel P of FIG. 1 according to one implementation. Referring to FIG. 2, the pixel P may include a pixel circuit PC, which is connected to the scan line SL and the data line DL, and a display element (100b of FIG. 3), for example, an organic light-emitting device OLED, which is connected to the pixel circuit PC.

The pixel circuit PC may include a driving thin film transistor T1, a switching thin film transistor T2, and a storage capacitor Cst. The switching transistor T2 may connected to the scan line SL and the data line DL and may transmit a data signal Dm, which is input through the data line DL, to the driving thin film transistor T1 according to a scan signal Sn input through the scan line SL.

The storage capacitor Cst may be connected to the switching thin film transistor T2 and a first voltage line 210. The storage capacitor may store a voltage corresponding to a difference between a voltage that is received from the switching thin film transistor T2 and a first power voltage ELVDD, which is supplied from the first voltage line 210.

The driving thin film transistor T1 may be connected to the first voltage line 210 and the storage capacitor Cst. The driving thin film transistor may control a driving current that flows from the first voltage line 210 to the organic light-emitting device OLED according to a value of the voltage that is stored in the storage capacitor Cst. The organic light-emitting device OLED may emit light having a luminance according to the driving current.

A structure of the display unit 100 will be described in detail with reference to FIG. 3. For convenience, FIG. 3 illustrates the driving thin film transistor T1 only without the switching thin film transistor T2 and the storage capacitor Cst of FIG. 2. The driving thin film transistor T1 is referred to as a thin film transistor 100a hereinafter.

A buffer layer 102 may be over the substrate 101. The buffer layer may provide a flat surface to an upper portion of the substrate 101 and may prevent introduction of foreign materials and moisture through the substrate 101. For example, the buffer layer 102 may include an inorganic material, such as, for example, silicon oxide, silicon nitride, silicon oxynitride, aluminum oxide, aluminum nitride, titanium oxide, titanium nitride, etc., an organic material, such as, for example, polyimide, polyester, acryl, etc., or a stack structure including the above-described materials.

The thin film transistor 100a and a display element 100b connected to the thin film transistor 100a may be over the substrate 101.

The thin film transistor 100a may include an active layer 103, a gate electrode 105, a source electrode 107, and a drain electrode 108. The thin film transistor 100a may have a suitable structure. For example, the thin film transistor 100a is described and illustrated as a top gate type in which the active layer 103, the gate electrode 105, the source electrode 107, and the drain electrode 108 are disposed in order. In other implementations, the thin film transistor may be, for example, a bottom gate type.

The active layer 103 may include a suitable semiconductor material. For example, the active layer 103 may include amorphous silicon or polysilicon. In some implementations, the active layer 103 may include an organic semiconductor material. In some implementations, the active layer 103 may include an oxide semiconductor material. For example, the active layer 103 may include 12, 13, and 14-group metal elements such as zinc (Zn), indium (In), Gallium (Ga), tin (Sn), cadmium (Cd), germanium (Ge), etc., and an oxide material including a combination of the above-described elements.

A gate insulating film 104 may be over the active layer 103. The gate insulating film 104 may include a multilayer film of a single layer film including an inorganic material such as silicon oxide and/or silicon nitride. The gate insulating film 104 may insulate the active layer 103 and the gate electrode 105 from each other. The gate insulating film 104 may be disposed in the display area DA and may extend into a portion of the non-display area NDA.

The gate electrode 105 is over an upper surface of the gate insulating film 104. The gate electrode 105 may be connected to a gate line and may supply an on/off signal to the thin film transistor 100a.

The gate electrode 105 may include a metal material having a low-electrical resistance. For example, the gate electrode 105 may include a single layer or a multilayer including one or more materials including aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), etc.

An interlayer insulating film 106 may be disposed over the gate electrode 105. The interlayer insulating layer 106 may insulate the gate electrode 105 from the source electrode 107 and the drain electrode 108. The interlayer insulating film 106 may be located in the display area DA and may extend into a portion of the non-display area NDA.

The interlayer insulating film 106 may include a single layer film or a multilayer film including a film having an organic material. For example, the organic material may include a commercial polymer such as polymethylmethacrylate (PMMA) or polystyrene (PS), a phenol-based polymer derivative, an acryl-based polymer, an imide-based polymer, an aryl ether-based polymer, an amide-based polymer, a fluoride-based polymer, a p-xylene-based polymer, a vinyl alcohol-based polymer, or a blend thereof.

A first conductive member MP1 may be disposed over the interlayer insulating film 106. The first conductive member MP1 may include the source electrode 107 and the drain electrode 108. The source electrode 107 and the drain electrode 108 may contact the active layer 103.

The source electrode 107 and the drain electrode 108 may be a single layer or may be a multilayer including one or more materials such as aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), etc. For example, the source electrode 107 and the drain electrode 108 may include a stack structure including three layers of titanium (Ti), aluminum (Al), and titanium (Ti).

The planarization layer 109 may be over the thin film transistor 100a. The planarization layer 109 may remove a step of the thin film transistor 100a, may planarize an upper surface of the thin film transistor 100a, and may prevent a defect from the display element 100b due to irregularities of the thin film transistor 100a disposed therebelow.

The planarization layer 109 may be a single layer or may be a multilayer including a film of an organic material. The organic material may include general commercial polymer such as polymethylmethacrylate (PMMA) or polystyrene (PS), phenol-based polymer derivative, acryl-based polymer, imide-based polymer, aryl ether-based polymer, amide-based polymer, fluoride-based polymer, p-xylene-based polymer, vinyl alcohol-based polymer, and a blend thereof. The planarization layer 109 may include a complex stack structure including an inorganic insulating film and an organic insulating film.

The planarization layer 109 may include a divisional portion V that surrounds the display area DA in the non-display area NDA. The divisional portion V may be an area in which portions of the interlayer insulating film 106 and the planarization layer 109 are removed. The divisional portion V may prevent the introduction of moisture and oxygen from outside into the display area DA through the interlayer insulating film 106 and the planarization layer 109. The divisional portion V may divide the planarization layer 109 into a central portion 109a and a peripheral portion 109b, and may include a dam portion 109c, as discussed below.

The display element 100b may be over the planarization layer 109. The display element 100b may include an organic light-emitting device including a first electrode 111, a second electrode 113 opposite to the first electrode 111, and intermediate layer 112 interposed between the first electrode 111 and the second electrode 112.

The first electrode 111 may be over the planarization layer 109 and may be electrically connected to the thin film transistor 100a. The first electrode 111 may have a suitable shape. For example, the first electrode 111 may be an island type shape formed by patterning.

The first electrode 111 may be a reflective electrode. For example, the first electrode 111 may include a reflective film including silver (Ag), magnesium (Mg), aluminum (Al), platinum (Pt), palladium (Pd), gold (Au), nickel (Ni), neodymium (Nd), iridium (Ir), chromium (Cr), or a mixture thereof, and a transparent or semi-transparent electrode disposed over the reflective film. The transparent or semi-transparent electrode may include at least one of indium tin oxide (ITO), indium zinc oxide (IZO), zinc oxide (ZnO), indium oxide ($In_2O_3$), indium gallium oxide (IGO), or aluminum zinc oxide (AZO).

The second electrode 113 may be a transparent or semi-transparent electrode and may include a thin metal film having a low workability. The second electrode 113 may further include an auxiliary electrode layer or an auxiliary bus electrode that includes a material to form a transparent electrode on the thin metal film. The material may include indium tin oxide (ITO), indium zinc oxide (IZO), zinc oxide (ZnO), and indium oxide ($In_2O_3$). Accordingly, the second electrode 113 may transmit light emitted from the organic light-emitting device that is included in the intermediate layer 112. The light emitted from the organic light-emitting device may be reflected by the first electrode 111 including a direct or reflective electrode and then may be emitted toward the second electrode 113.

In some implementations, the display unit 100 may be a rear light-emitting type, which emits light from an organic light-emitting layer toward a side of the substrate 101. In this case, the first electrode may include a transparent or semi-transparent electrode, and the second electrode may include a reflective electrode. In some implementations, the display unit 100 may be a double-side light-emitting type to emit light toward both the front side and the rear side.

A pixel defining film 119 may be over the first electrode 111. The pixel defining film 119 may include an insulating material. For example, the pixel defining film 119 may include an organic insulating material including one or more of polyimide, polyamide, acryl resin, benzocyclobutadiene, and phenol resin. The pixel defining film 119 may be formed, for example, by a spin-coating method. The pixel defining film 119 may expose a portion of the first electrode 111. The intermediate layer 112 including the organic light-emitting layer may be located at the exposed portion of the first electrode 111. For example, the pixel defining film 119 may define a pixel area of the organic light-emitting device.

The intermediate layer 112 may include an organic light-emitting layer that includes a low molecular organic material or a polymer organic material. The intermediate layer 112 may selectively further include a functional layer such as a hole transport layer (HTL), a hole injection layer (HIL), an electron transport layer (ETL), and an electron injection layer (EIL).

The divisional portion V may be located in the non-display area NDA. The divisional portion V may divide the voltage line 200 and the planarization layer 109 into the central portion 109a and the peripheral portion 190b. At least a portion of the voltage line 200 may be located in the divisional portion V. For example, a portion of the voltage line 200 may be exposed in the divisional portion V.

For example, the voltage line 200 may include a first voltage line 210, a second voltage line 220, and a third voltage line 230. For example, the first voltage line 210 may be a first power voltage (ELVDD) line, the second voltage line 220 may be a second power voltage (ELVSS) line, and the third voltage line 230 may be a gate wiring. FIG. 3 illustrates that the second voltage line 220 and the second electrode 113 are connected through a wiring 116. In some implementations, the second voltage line 220 and the second electrode 113 may be directly connected to each other. In some implementations, the third voltage line 230 may be electrically connected to the gate electrode 105.

Referring to FIG. 4, the first voltage line 210 may include a first main voltage line 212, which is disposed to correspond to a side of the display area DA, and a first connector 214, which connects the first voltage line 210 and the pad unit 150 to each other. For example, when the display area DA is rectangular, the first main voltage line 212 may be disposed to correspond to one of sides of the display area DA. The first main voltage line 212 may be parallel to one of the sides of the display area DA and may be longer than the one of the sides of the display area DA. The one of the sides of the display area DA may correspond to the first main voltage line 212 and may be disposed adjacent to the pad unit 150 (see, for example, FIG. 1).

The first connector 214 may extend along a first direction from the first main voltage line 212 and may cross the divisional portion V. Here, the term "first direction" refers to a direction from the display area DA toward the pad unit 150. The first connector 214 may be electrically connected to the pad unit 150. The first main voltage line 212 may be covered by the central portion 109a. A portion of the first connector 214 may be exposed at the divisional portion V.

The second voltage line 220 may include a second main voltage line 222, which surrounds both ends of the first main voltage line 212 and a remaining portion of the display area DA, i.e., a portion other where a central portion of the first main voltage line 212 is located, and a second connector 224, which extends along the first direction from the second main voltage line 222 and crosses the divisional portion V. In particular, the second main voltage line 222 may extend along and overlap both ends of the first main voltage line 212 in the first and second directions. The second connector 224 may be electrically connected to the pad unit 150. A portion of the second connector 224 may be exposed at the divisional portion V.

The third voltage line 220 may include a third main voltage line 232, which surrounds the display area DA, a portion other where a central portion of the first main voltage line 212 is located, and a third connector 234, which extends along the first direction from the third main voltage line 232 and crosses the divisional portion V. The third connector 234 may be electrically connected to the pad unit 150. A portion of the third voltage line 230 may be exposed at the divisional portion V.

The third voltage line 230 may intersect at least one of the first voltage line 210 and the second voltage line 220 in the divisional portion V. For example, as shown in the enlarged view in FIG. 4, the third voltage line 230 and the first connector 214 of the first voltage line 210 intersect and overlap each other, the third voltage line 230 and the second voltage line 220 intersect and overlap each other along the second direction adjacent to the first connector 214, and the first voltage line 210, the second voltage line 220, and the third voltage line 230 extend from corresponding intersections in a direction parallel to each other.

In some implementations, the third voltage line 230 may intersect the first voltage line 210 only or the second voltage line 220 only. For convenience, a structure, in which the first voltage line 210 and the third voltage line 230 intersect, the second voltage line 220 and the third voltage line 230 intersect, and the second voltage line 220 and the third voltage line 230 are extended from the intersection in a direction parallel to each other, will be explained hereinafter.

Moreover, FIG. 4 illustrates that the third voltage line 230 intersects the first voltage line 210 and the second voltage line 220 in the divisional portion V adjacent to the pad unit 150 of FIG. 1. In some implementations, the third voltage line 230 may intersect the first voltage line 210 or the second voltage line 220 in the divisional portion V, which surrounds a peripheral of the display area DA.

For example, the third main voltage line 232 adjacent to the third connector 234 of the third voltage line 230 may intersect one of the first voltage line 210 and the second voltage line 220 in the divisional portion V. For convenience, FIG. 4 illustrates that the third voltage line 230 intersects the first voltage line 210 in the divisional portion V from which the interlayer insulating film 106 and the planarization layer 109 are removed.

Hereinafter, a structure of the voltage line 200 adjacent to the pad unit 150 will be explained with reference to FIGS. 4, 5, and 6.

Figure 5:
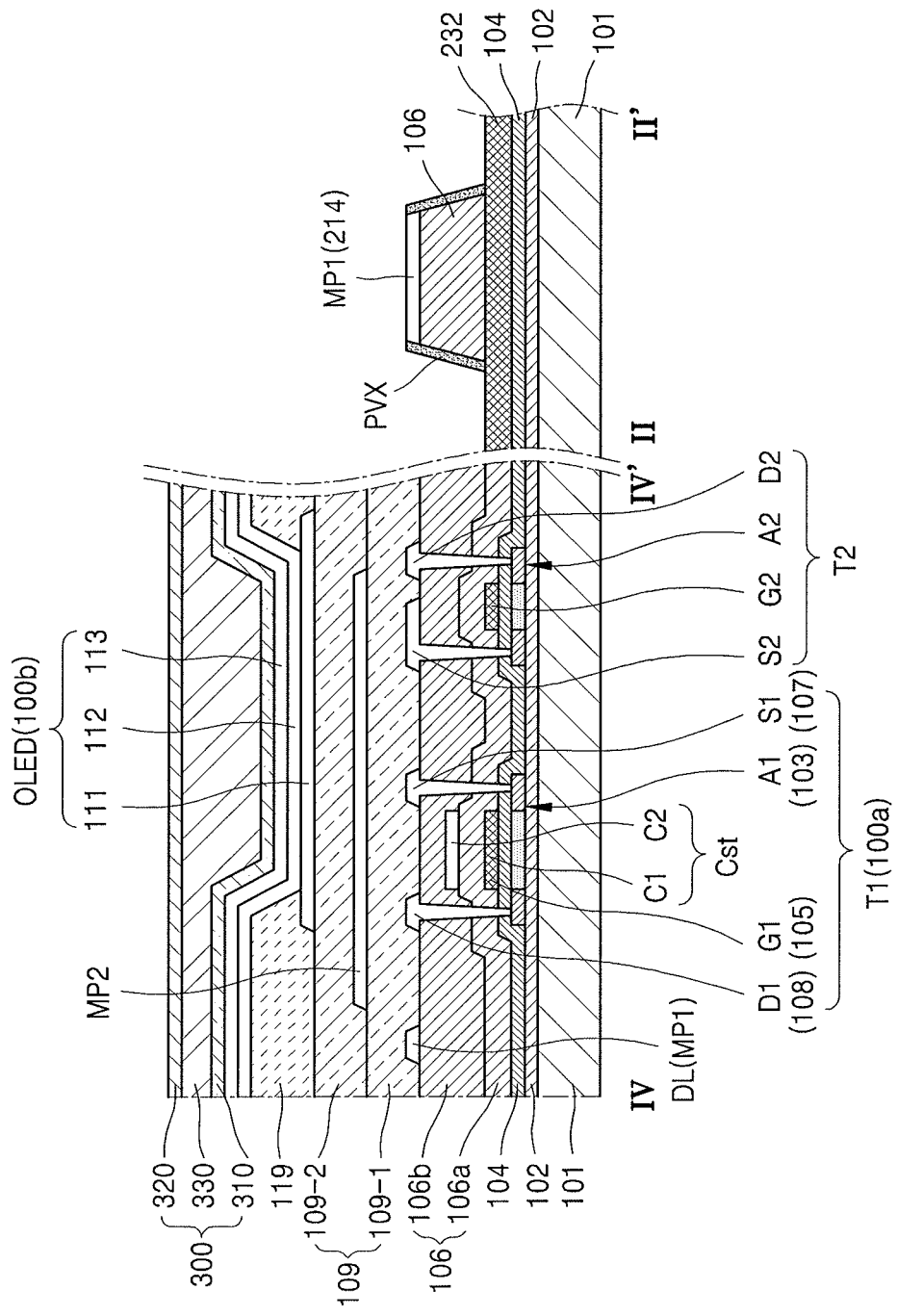
FIG. 5 illustrates a cross-sectional view taken along a line IV-IV' of FIG. 1 and a line II-II' of FIG. 4.
Figure 6:
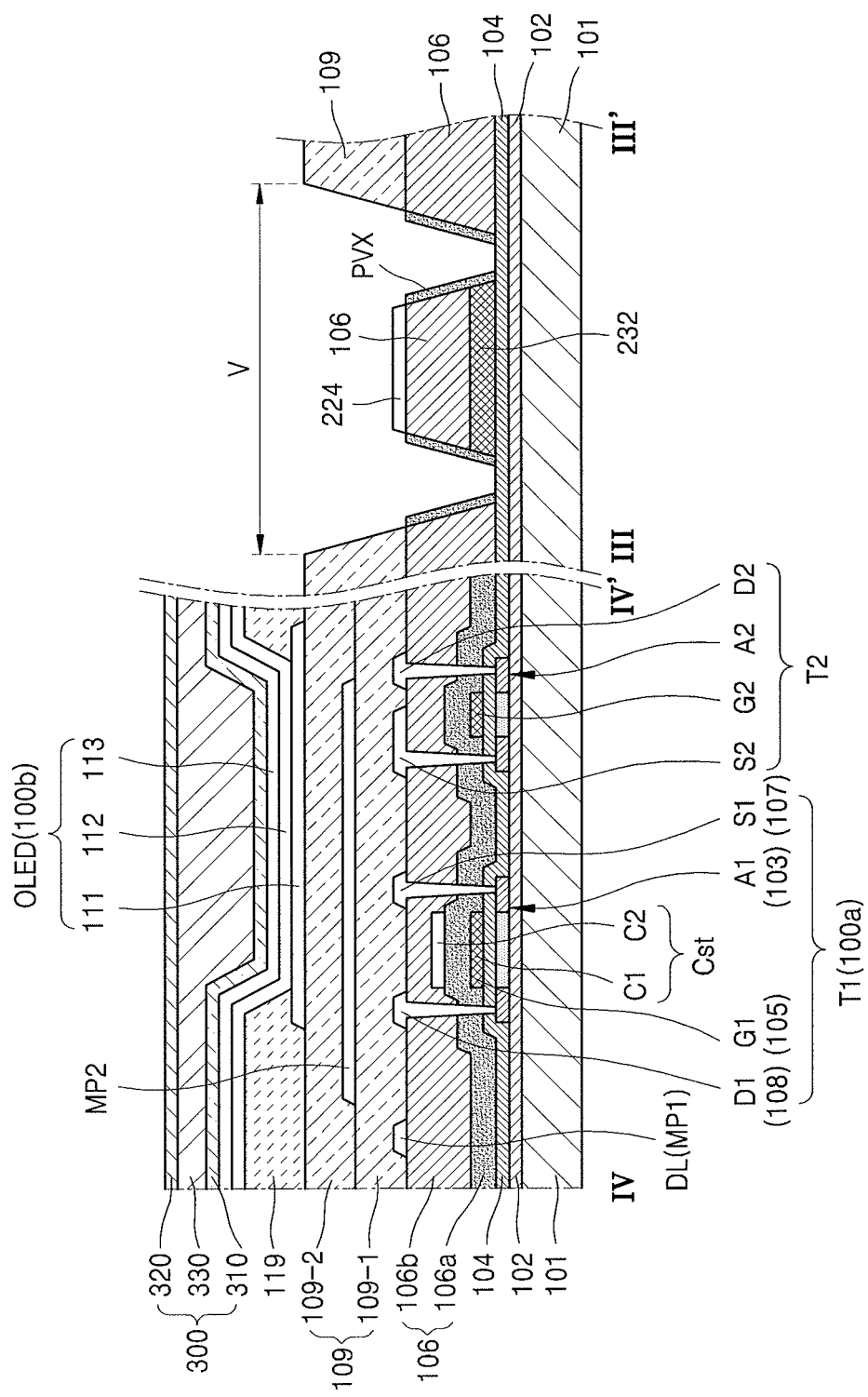
FIG. 6 illustrates a cross-sectional view taken along a line IV-IV' of FIG. 1 and a line of FIG. 4.

FIG. 5 illustrates a cross-sectional view taken along a line IV-IV' of FIG. 1 and a line II-IF of FIG. 4, and FIG. 6 illustrates a cross-sectional view taken along a line IV-IV' of FIG. 1 and a line of FIG. 4.

Left sides of FIGS. 5 and 6 illustrate cross-sectional views depicting an example of a pixel P in the display area. For convenience, the driving thin film transistor T1, the switching thin film transistor T2, and the storage capacitor Cst are illustrated in FIGS. 5 and 6.

In detail, a right side of FIG. 5 illustrates a cross-sectional view depicting an intersection of the first connector 214 and the third connector 234 along a direction parallel to a second direction in which the divisional portion V is extended, and a right side of FIG. 6 illustrates a cross-sectional view depicting an intersection of the third connector 234 and the second connector 224 in a direction parallel to the first direction which crosses the divisional portion V.

In the left sides of FIGS. 5 and 6, a buffer layer 102 is disposed over a substrate 101, and a first thin film transistor T1 and a second thin film transistor T2 are disposed over the buffer layer 102.

The first thin film transistor T1 may be a driving thin film transistor and may include an active layer A1, a gate electrode G1, a source electrode S1, and a drain electrode D1. The second thin film transistor T2 may be a switching thin film transistor and may include an active layer A2, a gate electrode G2, a source electrode S2, and a drain electrode D2.

FIGS. 5 and 6 illustrate a top gate type in which the gate electrodes G1 and G2 of the first thin film transistor T1 and the second thin film transistor T2 are respectively disposed over the active layers A1 and A2 through the gate insulating film 104. In some implementations, the first thin film transistor T1 and the second thin film transistor T2 may be a bottom gate type.

The active layers A1 and A2 of the first thin film transistor T1 and the second thin film transistor T2 may include amorphous silicon or polycrystalline silicon. In some implementations, the active layers A1 and A2 of the first thin film transistor T1 and the second thin film transistor T2 may include an oxide including one or more materials of indium (In), gallium (Ga), tin (Sn), zirconium (Zr), vanadium (V), hafnium (Hf), cadmium (Cd), germanium (Ge), chromium (Cr), titanium (Ti), and zinc (Zn). The active layers A1 and A2 may include a channel area and also a source area and a drain area into which impurities are doped.

A gate insulating film 104 may be over the active layers A1 and A2. The gate electrodes G1 and G2 of the first thin film transistor T1 and the second thin film transistor T2 may be over the gate insulating film 104. The gate electrode G1 of the first thin film transistor T1 may be a first electrode C1 of a storage capacitor Cst.

A first interlayer insulating film 106a may be disposed over the gate electrodes G1 and G2 and may be a single layer or a multilayer including an organic material. A second electrode C2 of the storage capacitor Cst may be disposed over the first interlayer insulating 106a such that the second electrode C2 intersects the first electrode C1. The first electrode C1 may be the same electrode as the gate electrode G1 of the first thin film transistor T1. Thus, the storage capacitor Cst may intersect the first thin film transistor T1. The first electrode C1 and the second electrode C2 may be connected to the third main voltage line 232 of the third voltage line 230, which is illustrated in FIGS. 5 and 6.

A second interlayer insulating film 106b may be disposed over the second electrode C2. A first conductive member MP1 may be disposed over the second interlayer insulating film 106b. A stack structure of the first interlayer insulating film 106a and the second interlayer insulating film 106b may be the same as the interlayer insulating film 106 that is illustrated in FIG. 3 and the interlayer insulating film 106 that is illustrated on the right side of FIGS. 5 and 6.

Meanwhile, the first conductive member MP1 may include the source electrode S1 and S2 and the drain electrodes D1 and D2 of the first thin film transistor Ti and the second thin film transistor T2, and also the data line DL. The first conductive member MP1 may include a stack structure including a first layer including titanium (Ti), a second layer including aluminum (Al), and a third layer including titanium (Ti).

A first planarization layer 109-1 may be over the first conductive member MP1. A second conductive member MP2 may be disposed over the first planarization layer 109-1. The second conductive member MP2 may include a stack structure, which may be same as the stack structure of the first conductive member MP1. For example, the second conductive member MP2 may include a first layer including titanium (Ti), a second layer including aluminum (Al), and a third layer including titanium (Ti).

The second conducive member MP2 may be interposed between the gate electrode G1 of the first thin film transistor T1 and a first electrode 111 of an organic light-emitting device OLED such that generation of a parasite capacitance between the gate electrode G1 of the first thin film transistor T1 and the first electrode 111 of the organic light-emitting device OLED may be minimized or prevented.

A second planarization layer 109-2 may be over the second conductive member MP2. A combination of the first planarization layer 109-1 and the second planarization layer 109-2 may be same as the planarization layer 109 illustrated in FIG. 3.

The organic light-emitting device OLED may be over the second planarization layer 109-2. The organic light-emitting device OLED may include the first electrode 111, a second electrode 113, and an intermediate layer 112 between the first electrode 111 and the second electrode 113. A divisional portion V, which may be the divisional portion V illustrated in FIG. 3, may divide the first planarization layer 109-1 and the second planarization layer 109-2 of FIG. 5 into the central portion 109a of FIG. 3 and a peripheral portion 109b of FIG. 3.

The first electrode 111 may be electrically connected to the drain electrode D1 of the first thin film transistor T1 through a second light-emission control thin film transistor T2 illustrated in FIG. 6 and the second electrode 113 may be electrically connected to a second voltage line 220 as illustrated in FIG. 4.

As illustrated in the right sides of the FIGS. 5 and 6, a portion of the interlayer insulating film 106 may be interposed between the third main voltage line 232 in the divisional portion V and first connector 214 of the first voltage line 210. To provide this structure, an entirety of the interlayer insulating film 106 is not removed during a process of removing the interlayer insulating film 106 and the planarization layer 109 from the divisional portion V. A portion of the interlayer insulating film 106 is kept between the third main voltage line 232 and the first connector 214 such that a short circuit that could be generated if the third main voltage line 232 and the first voltage line 210 were to directly contact each other is prevented.

However, since the interlayer insulating film 106 includes an organic material, there is a possibility that moisture or oxygen could permeate into a side of the display area DA to cause a defect in the display element 100b. In order to prevent or reduce the likelihood of an occurrence of such a defect, a protecting film PVX including an inorganic material may cover a side of the remaining portion of the interlayer insulating film 106 at the intersection of the third main voltage line 232 and the first connector 214 in the divisional portion V.

For example, the protecting film PVX including the inorganic material may cover both sides of the interlayer insulating film 106 which is exposed to the outside in the divisional portion V. Accordingly, moisture or oxygen may be prevented by the protecting film PVX from permeating into an inside of the display area DA along the interlayer insulating film 106 including the organic material. Accordingly, a generation of defects such as a dark spot is minimized or prevented. Moreover, the permeation of moisture or oxygen into the display area DA from the sides of the interlayer insulating film 106 may be prevented even when the divisional portion V is bent.

The protecting film PVX may be formed, for example, by removing the interlayer insulating film 106 and the planarization layer 109 from the divisional portion V, depositing the source electrodes S1 and S2 and the drain electrodes D1 and D2, depositing an inorganic film on a front side thereof, and then dry-etching the inorganic film. For example, according to the dry-etching, the organic material, which has been deposited in a horizontal direction may be etched, and the protecting film PVX, which has been deposited in a vertical direction, is not etched but remains attached to the side of the interlayer insulating film 106.

FIG. 5 illustrates that the protecting film PVX covers the interlayer insulating film 106 and also a side of the first connector 214. In some implementations, the protecting film PVX may cover a side of the interlayer insulating film 106 and may not cover a side of the first connector 214.

For example, as illustrated in FIG. 6, the protecting film PVX may not cover a side of the second connector but may cover the sides of the third main voltage line 232 and the interlayer insulating film 106. When the protecting film PVX covers the side of the interlayer insulating film 106 of the organic material, the permeation of the moisture or oxygen into an inside of the display area DA along the sides of the interlayer insulating film 106 may be minimized or prevented. Accordingly, the protecting film PVX may cover the side of the interlayer insulating film, and the first connector 214 and the second connector 224 and the interlayer insulating film 106 may be separated from the outside.

The planarization layer 109 may be disposed over portion of the interlayer insulating film 106 that is is stacked outside the divisional portion V as illustrated in FIG. 6. The protecting film PVX may be disposed over a side of the interlayer insulating film 106.

The voltage line 200 may include the first conductive member MP1. The first conductive member MP1 may include the same material as the source electrodes S1 and S2 and the drain electrodes D1 and D2. For example, the voltage line 200 may include a stack structure including a first layer of titanium (Ti), a second layer of aluminum (Al), and a third layer of titanium (Ti). Although FIG. 5 illustrates first connector 214 as being a single layer, in some implementations, the first connector 214 may include a multilayer structure (Ti/Al/Ti) including the above described first, second, and third layers.

Referring back to FIG. 3, the dam portion 109c may be located at the divisional portion V. When an organic film 330 of a thin film encapsulating layer 300 is formed to seal the display unit 100, the dam portion 109c may prevent a flow of an organic material along a peripheral direction of a substrate 101. Thus, formation of an edge tail of the organic film 330 may be minimized or prevented.

The dam portion 109c may overlap and contact an outside peripheral portion of the second voltage line 220 that corresponds to the second main voltage line 222 of FIG. 4 and thus cover an outer side of the second main voltage line 222.

The dam portion 109c may be disposed on the same layer as the planarization layer 109 and may include the same material as the planarization layer 109. In some implementations, the dam portion 109c may include two or more layers. For example, when the dam portion 109c includes a two-layer structure, a lower layer of the two-layer structure may include the same material as the planarization layer 109, and an upper layer of the two-layer structure may include the same material as the pixel defining film 119. In some implementations, the dam portion 109c may include more than two portions. When the dam portion 109c includes a plurality of portions, a height of the dam portion 109c may increase according to a distance from a peripheral portion of the substrate 101.

The thin film encapsulating film 300 may seal the display unit 100 and may minimize or prevent the permeation of external moisture or oxygen into the display unit 100. The thin film encapsulating film 300 may include at least one inorganic film 310 and/or 320 and at least one organic film 330. Although FIG. 3 illustrates the thin film encapsulating film 300 including the two inorganic films 310 and 320 and the organic film 330 which are alternately stacked, in some implementations, the thin film encapsulating film 300 may include a plurality of additional inorganic films and additional organic films that are alternately stacked.

For example, the organic film 330 may include one or more materials selected from a group including an acryl-based resin, poly isoprene, a vinyl-based resin, an epoxy-based resin, a urethane-based resin, a cellulose-based resin, and a perylene-based resin.

The inorganic films 310 and 320 may include at least one selected from a group including silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride (SiON).

The dam portion 109c may block a flow of an organic material in a direction toward the periphery of the substrate 101 when the organic film 330 is formed. Accordingly, the organic film 330 may be disposed inside the dam portion 109c. In some implementations, the inorganic films 310 and 320 may be formed to be larger than the organic film 330 and to cover the peripheral portion 109b. In this case, the divisional portion V may be covered by the inorganic films 310 and 320.

As described above, the side portions of the voltage line 200 may be covered by the inorganic films 310 and 320 in the divisional portion V. Accordingly, permeation of external moisture and oxygen into the display element may be minimized or prevented such that defects such as dark spots are reduced. As illustrated in FIGS. 5 and 6, the protecting film PVX may expose upper surfaces of the first connector 214 and the second connector 224 such that the exposed upper surfaces of the first connector 214 and the second connector 224 may be covered by the inorganic films 310 and 320.

The inorganic films 310 and 320 may extend to the peripheral portion 109b, and the inorganic films 310 and 320 may contact each other to the outside of the peripheral portion 109b. Moreover, at least one of the inorganic films 310 and 320 may contact the gate insulating film 104 to an inside the peripheral portion 109b, and may also contact the interlayer insulating film 106 at an outside of the peripheral portion 109b. According to this structure, permeation of the external moisture through the side of the substrate 101 may be prevented, and a bonding force of the thin film encapsulating film 300 may be increased.

By way of summation and review, a display apparatus having slim and flexible characteristics may include an organic insulating film to improve flexibility of the display apparatus. However, external moisture and oxygen may permeate into the display apparatus through the organic insulating film to cause defects, such as dark spots.

Embodiments provide a display apparatus that prevents permeation of external moisture of oxygen into a display element from the outside.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display apparatus, comprising:
   a substrate;
   a display unit over the substrate, the display unit including a thin film transistor, a display element connected to the thin film transistor, and a planarization layer interposed between the thin film transistor and the display element, the display unit including a display area to display an image, and a non-display area located outside of the display area, the non-display area including a plurality of voltage lines, wherein the planarization layer extends into the non-display area and includes a divisional portion that divides the planarization layer into a central portion and a peripheral portion, the divisional portion surrounding the display area;
   an interlayer insulating film between the plurality of voltage lines at intersections of the plurality of voltage lines with each other in the divisional portion; and
   a protecting film covering a side of the interlayer insulating film in the divisional portion.

2. The display apparatus as claimed in claim 1, wherein:
   the plurality of voltage lines include a first voltage line, a second voltage line, and a third voltage line to which different voltages are respectively supplied;
   the first voltage line includes a first main voltage line corresponding to a portion of the display area, and a first connector protruding from the first main voltage line along a first direction and crossing the divisional portion;
   the second voltage line includes a second main voltage line surrounding both ends of the first main voltage line and a remaining portion of the display area, and a second connector protruding from the first main voltage line along the first direction and crossing the divisional portion;
   the third voltage line includes a third main voltage line surrounding both ends of the first main voltage line and the remaining portion of the display area, and a third connector protruding from the first main voltage line along the first direction and crossing the divisional portion; and
   the first connector, the second connector, and the third connector are connected to a pad unit.

3. The display apparatus as claimed in claim 2, wherein the third voltage line intersects at least one of the first voltage line and the second voltage line.

4. The display apparatus as claimed in claim 3, wherein:
   the first voltage line is over an upper surface of the interlayer insulating film, and
   the protecting film covers at least a portion of a side of the first voltage line disposed over the upper surface of the interlayer insulating film.

5. The display apparatus as claimed in claim 4, wherein:
   the protecting film exposes an upper surface of the first voltage line in the divisional portion,
   a thin film encapsulating layer seals the display unit, and
   the exposed upper surface of the first voltage line in the divisional portion directly contacts the thin film encapsulating layer.

6. The display apparatus as claimed in claim 3, wherein:
   the second voltage line is over an upper surface of the interlayer insulating film; and
   the protecting film covers at least a portion of a side of the second voltage line disposed over the upper surface of the interlayer insulating film.

7. The display apparatus as claimed in claim 6, wherein:
   the protecting film exposes an upper surface of the second voltage line in the divisional portion, and
   the exposed upper surface of the second voltage line in the divisional portion directly contacts the thin film encapsulating layer.

8. The display apparatus as claimed in claim 2, wherein the first connector, the second connector, and the third connector are parallel to each other and spaced from each other in a second direction intersecting the first direction.

9. The display apparatus as claimed in claim 8, wherein:
the first connector is over an upper surface of the interlayer insulating film, and
the protecting film covers at least a portion of the first connector disposed over the upper surface of the interlayer insulating film.

10. The display apparatus as claimed in claim 9, wherein:
the protecting film exposes an upper surface of the first connector in the divisional portion, and
the exposed upper surface of the first connector in the divisional portion directly contacts the thin film encapsulating layer.

11. The display apparatus as claimed in claim 8, wherein:
the second connector is located over an upper surface of the interlayer insulating film, and
the protecting film covers at least a portion of a side of the second connector located over an upper surface of the interlayer insulating film.

12. The display apparatus as claimed in claim 11, wherein:
the protecting film exposes an upper surface of the second connector, and
the exposed upper surface of the second connector in the divisional portion directly contacts the thin film encapsulating layer.

13. The display apparatus as claimed in claim 1, wherein the interlayer insulating film includes an organic material.

14. The display apparatus as claimed in claim 1, wherein the protecting film includes an inorganic material.

15. The display apparatus as claimed in claim 1, wherein the central portion of the planarization layer overlaps and contacts an inside periphery of the second main voltage line.

16. The display apparatus as claimed in claim 15, further comprising:
a dam portion overlapping and contacting an outside periphery of the second main voltage line, wherein the dam portion is in the divisional portion.

17. The display apparatus as claimed in claim 16, wherein the dam portion includes a same material as the planarization layer.

18. The display apparatus as claimed in claim 16, wherein:
the thin film encapsulating film includes more than one organic film and more than one inorganic film,
the more than one organic film is within a boundary defined by the dam portion, and
the more than one inorganic film extends to an outside of the peripheral portion.

19. The display apparatus as claimed in claim 1, wherein the display element includes:
a first electrode electrically connected to the thin film transistor;
a second electrode corresponding to the first electrode; and
an intermediate layer including an organic light-emitting layer interposed between the first electrode and the second electrode.

20. A display apparatus, including:
a substrate;
a plurality of pixels on a display area of the substrate;
a non-display area surrounding the display area of the substrate, the non-display area including a pad area and a plurality of voltage lines connecting the pad area and the display area;
a planarization layer that extends from the display area into the non-display area, the planarization layer including a central portion, a peripheral portion, and a divisional portion between the central portion and the peripheral portion of the planarization layer, the divisional portion being in the non-display area surrounding the display area, and
wherein:
the non-display area includes:
a first connector extending from a first main voltage line and crossing the divisional portion and connecting to the pad area,
a second connector extending from a second main voltage line in the divisional portion and connecting to the pad area,
a third connector extending from a third main voltage line in the divisional portion and connecting to the pad area, wherein the third connector intersects at least one of the first connector and the second connector in the divisional portion, the third connector being separated from the at least one of the first connector and the second connector by an interlayer insulating film, and
a protecting film covers sides of the interlayer insulating film in the divisional portion.

21. The display apparatus as claimed in claim 20, wherein:
the interlayer insulating film is an organic film, and
the protecting film is an inorganic film.

22. The display apparatus as claimed in claim 20, wherein:
the second connector intersects the third connector in a parallel overlapping manner, and
the protecting film covers sides of the third connector and the interlayer insulating film.

23. The display apparatus as claimed in claim 22, wherein:
the interlayer insulating film is substantially absent from the divisional portion, except for being between the second connector and the third connector, and
the protecting film further covers sides of the interlayer insulating film at a boundary between the divisional portion and the display area and at a boundary between the divisional portion and a portion of the non-display area surrounding the divisional portion.

24. The display apparatus as claimed in claim 20, wherein:
the first connector crosses the third connector, and
the protecting film covers sides of the first connector and the interlayer insulating film.

25. The display apparatus as claimed in claim 20, wherein,
the central portion of the planarization layer overlaps and contacts an inside periphery of the second main voltage line, and
the planarization layer further includes a dam portion that contacts an outside periphery of the second main voltage line.

* * * * *